United States Patent
Shin (10) Patent No.: US 7,463,538 B2
(45) Date of Patent: Dec. 9, 2008

(54) SEMICONDUCTOR MEMORY DEVICE HAVING A PRECHARGE CONTROL CIRCUIT FOR REDUCING CURRENT DURING CONTINUOUS WRITE OPERATION

(75) Inventor: Jun-Ho Shin, Gyeonggi-do (KR)

(73) Assignee: Samsung Electronics Co., Ltd., Suwon-si, Gyeoggi-do (KR)

( * ) Notice: Subject to any disclaimer, the term of this patent is extended or adjusted under 35 U.S.C. 154(b) by 98 days.

(21) Appl. No.: 11/350,249

(22) Filed: Feb. 7, 2006

(65) Prior Publication Data
US 2006/0193196 A1 Aug. 31, 2006

(30) Foreign Application Priority Data
Feb. 14, 2005 (KR) .................. 10-2005-0011813

(51) Int. Cl.
G11C 7/00 (2006.01)
(52) U.S. Cl. ...................... 365/203; 365/221
(58) Field of Classification Search ................ 365/194, 365/195, 230 O, 221 X, 230.03, 203, 221
See application file for complete search history.

(56) References Cited

U.S. PATENT DOCUMENTS 5,784,329 A * 7/1998 Blankenship et al. ....... 365/227
6,771,550 B2 * 8/2004 Park .......................... 365/203
7,151,696 B2 * 12/2006 Suh et al. ................ 365/185.25

* cited by examiner

Primary Examiner—VanThu Nguyen
(74) Attorney, Agent, or Firm—Marger Johnson & McCollom, P.C.

(57) ABSTRACT

We describe a semiconductor memory device having a precharge control circuit and an associated method for precharging the same. A semiconductor memory device having a series of circuits for writing data to memory cells includes an input and output line for transferring data to be written to each of the memory cells. A precharge control circuit is adapted to generate a precharge control signal for controlling a precharge disable state of the input and output line after application of a first write command. The disable state of the precharge control signal is maintained even after application of a second write command when performing a continuous write operation responsive to the second write command application without other commands applied subsequent to the first write command application. Avoiding precharging the input and output line in a continuous write operation, reduces current consumption.

25 Claims, 10 Drawing Sheets

SEMICONDUCTOR MEMORY DEVICE HAVING A PRECHARGE CONTROL CIRCUIT FOR REDUCING CURRENT DURING CONTINUOUS WRITE OPERATION

CROSS-REFERENCE TO RELATED APPLICATION

This application claims the benefit of Korean Patent Application No. 10-2005-00011813, filed Feb. 14, 2005, the disclosure of which we incorporate by reference.

BACKGROUND

1. Field

A semiconductor memory device and, more particularly, a semiconductor memory device having a precharge control circuit and an associated precharge method that reduces current consumption in a continuous writing operation.

2. Related Art

A semiconductor memory device repeatedly performs read and write operations. The read operation outputs data from a selected memory cell to circuitry external to the device. The write operation stores data, often received external to the device, in a selected memory cell.

A semiconductor memory device requires a precharging circuit for precharging input and output data lines to perform operations subsequent to the read or write operations.

The precharging circuit precharges input and output data lines responsive to the precharge control signal, including during continuous data write operations. That is, the precharging circuit precharges the input and output data lines between successive write operations.

Figure 1:
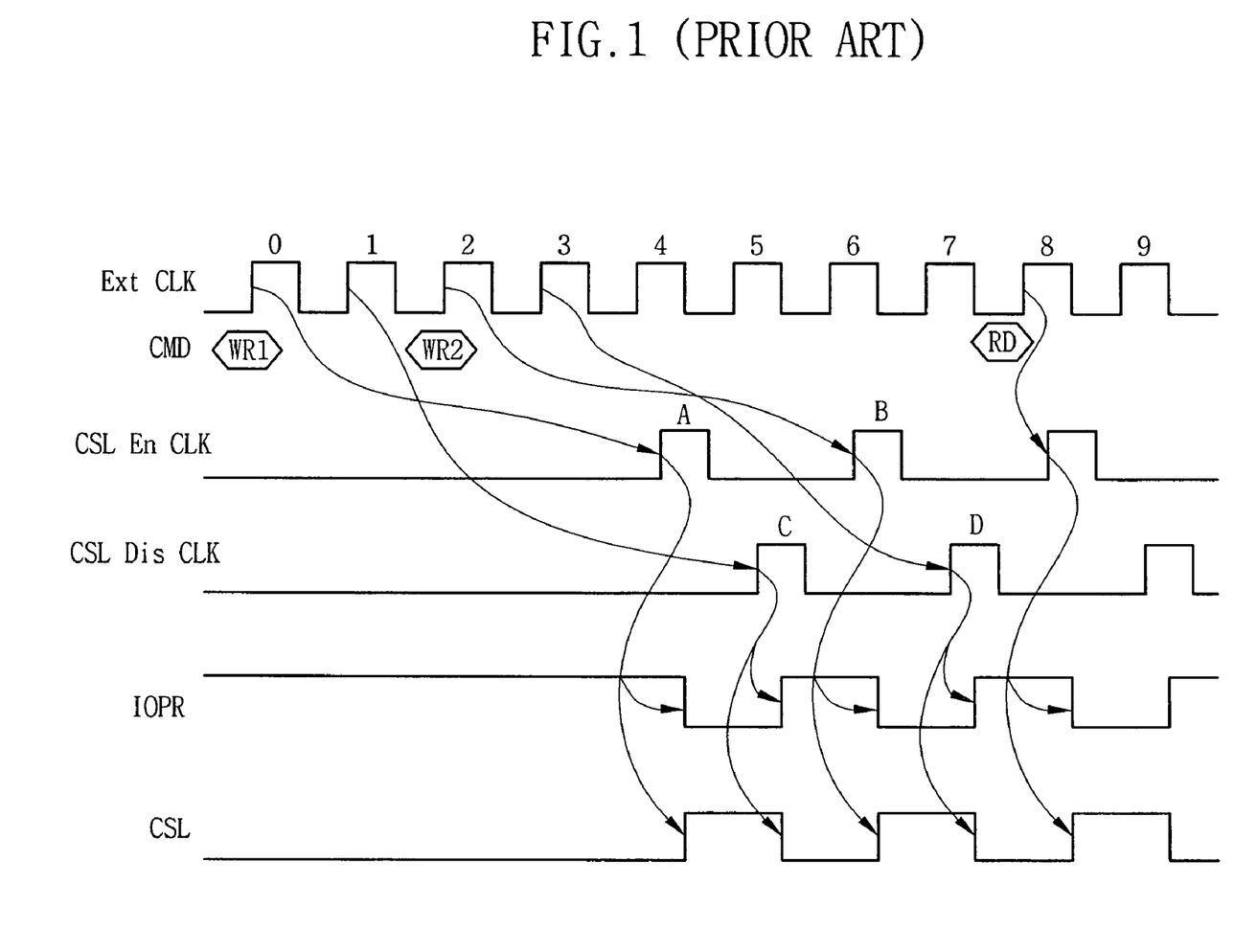
FIG. 1 is a timing diagram of a precharge control signal and a column select line signal when data of a burst length corresponding to 4 is continuously written in a semiconductor memory device.
Figure 2:
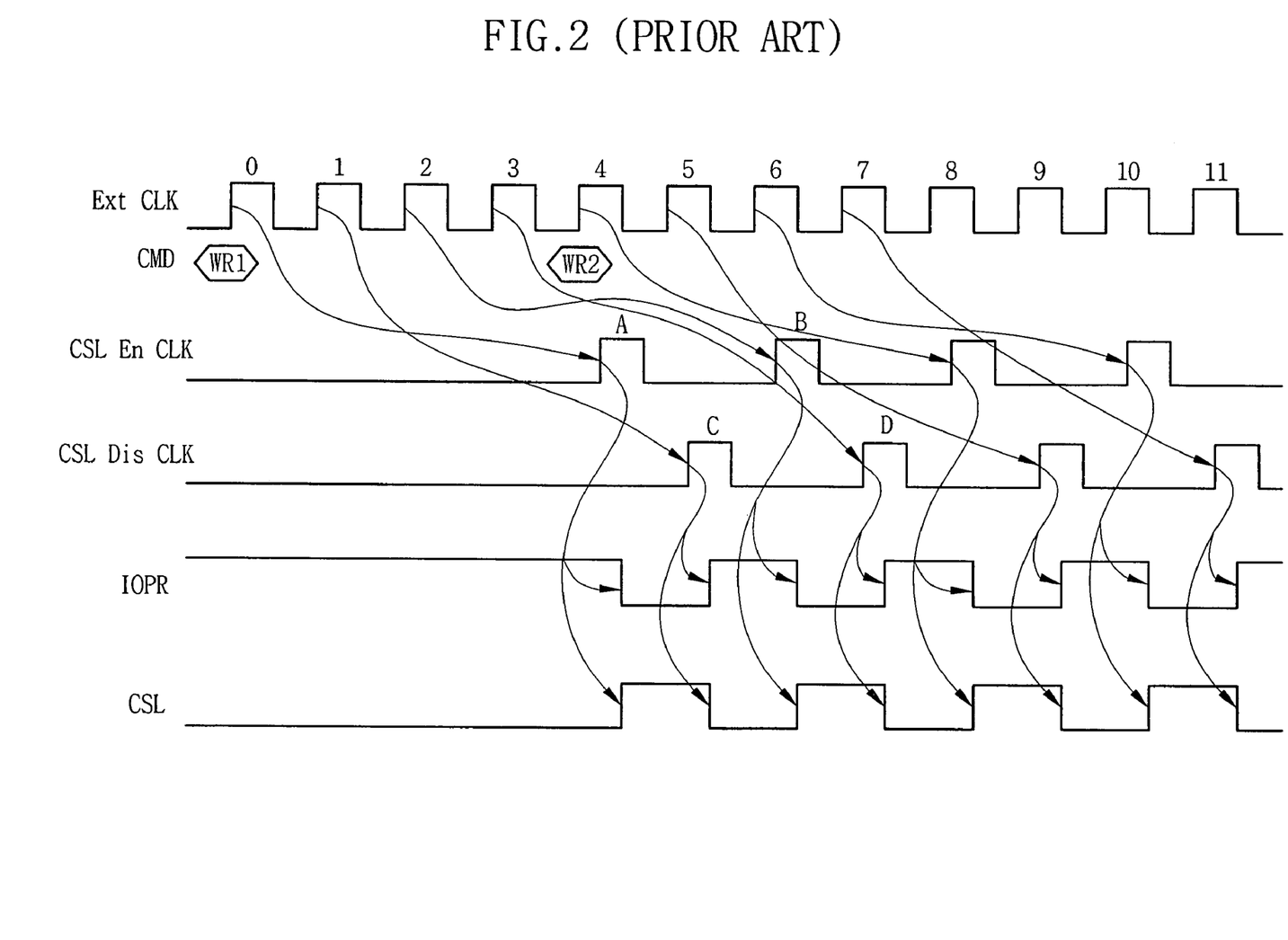
FIG. 2 is a timing diagram of a precharge control signal and a column select line signal when data of a burst length corresponding to 8 is continuously written in a semiconductor memory device.

FIGS. 1 and 2 are operation timing diagrams for precharging an input and output line in a continuous write operation in a semiconductor memory device having a double data rate (DDR) function. FIG. 1 is a timing diagram for controlling precharging an input and output line in a semiconductor memory device having a 4-bit prefetch structure for writing data having a burst length corresponding to 4 when a write command is continuously applied. FIG. 2 is a timing diagram for controlling precharging an input and output line to write data having a burst length corresponding to 8.

The DDR function refers to outputting data on both rising and falling edges of an external clock.

As shown in FIG. 1, an external clock signal Ext CLK and a first write command WR1 are applied. A second write command WR2 is applied two cycles from the external clock signal Ext CLK subsequent to the application of the first write command WR1 after a second write command WR2 is applied. The first and second write commands WR1 and WR2, respectively, enable the semiconductor memory device to perform the write operation. The first and second write commands WR1 and WR2 are applied in synchronization with the external clock signal Ext CLK.

When the first write command WR1 is applied synchronous to a pulse 0 of the external clock signal Ext CLK, a column select line enable signal CSL En CLK, pulse A is enabled a predetermined time after rising edge of the pulse 0. The column select line enable signal CSL En CLK, as its name suggests, enables a column select line CSL. The delay of the column select line enable signal CSL En CLK depends on write latency.

In response to a rising edge of the pulse A, a precharge control signal IOPR for controlling the precharge of the input and output line is disabled and the column select line CSL is enabled.

As a result, data is written via the input and output line responsive to the first write command WR1. A column select line disable signal CSL Dis CLK, pulse C, is enabled responsive to a rising edge of pulse 1 that follows pulse 0. The column select line disable signal CSL Dis CLK disables the column select line CSL. Responsive to a rising edge of the pulse C, the column select line CSL is disabled and the precharge control signal IOPR is enabled to precharge the input and output line.

After two external clock signal Ext CLK cycles, the second write command WR2 is applied synchronous with pulse 2 without any other command being applied after the first write command WR1. As the second write command WR2 is applied, the column select line enable signal CSL En CLK, pulse B, is enabled responsive to the rising edge of pulse 2. The delay of the column select line enable signal CSL En CLK depends on write latency.

Responsive to a rising edge of the pulse B, the precharge control signal IOPR is disabled and the column select line CSL is enabled.

As a result, data is written via the input and output line responsive to the second write command WR2. The column select line disable signal CSL Dis CLK pulse D, is then enabled responsive to a rising edge of pulse 3 that follows pulse 2 responsive to a rising edge of the pulse D, the column select line CSL is disabled and the precharge control signal IOPR is enabled to precharge of the input and output line.

For a continuous writing operation, the semiconductor memory device of FIG. 1 performs the precharge of the input and output line responsive to the column select line disable signal CSL Dis CLK subsequent to the first write command WR1. The semiconductor memory device completes the precharge of the input and output line responsive to the column select line enable signal CSL En CLK subsequent to the second write command WR2.

The semiconductor memory device repeatedly performs the above-described operation even upon the application of, for example, a read command RD.

As shown in FIG. 2, when a first write command WR1 is applied synchronous with a pulse 0 of an external clock signal Ext CLK, a column select line enable signal CSL En CLK, pulse A, is enabled with a predetermined delay responsive to a rising edge of the pulse 0. As before, the column select line enable signal CSL En CLK enables the column select line CSL. The delay of the column select line enable signal CSL En CLK depends on write latency.

Responsive to a rising edge of the pulse A, a precharge control signal IOPR is disabled so that precharge the input and output line stops, and the column select line CSL is enabled.

As a result, data is in part written via the input and output line responsive to the first write command WR1. A column select line disable signal CSL Dis CLK, pulse C, is enabled responsive to a rising edge of pulse 1 subsequent to pulse 0. Responsive to a rising edge of the pulse C, the column select line CSL is disabled and the precharge control signal IOPR is enabled to precharge the input and output line.

The column select line enable signal CSL En CLK, pulse B, is enabled responsive to the rising edge of pulse 2 of the external clock signal Ext CLK with a determined delay. The delay of the column select line enable signal CSL En CLK depends on write latency.

Responsive to a rising edge of the pulse B, the precharge control signal IOPR is disabled so that the precharge of the input and output line stops, and the column select line CSL is again enabled.

As a result, data is then written to the input and output line responsive to the second write command WR2. The column select line disable signal CSL Dis CLK, pulse D, is then enabled responsive to a rising edge of pulse 3 that is a next cycle of the pulse 2. Responsive to a rising edge of the pulse D, the column select line CSL is disabled and the precharge control signal IOPR is enabled to precharge the input and output line.

After four cycles of the external clock signal Ext CLK, the second write command WR2 is applied synchronous with pulse 4 without other commands. As the second write command WR2 is applied, subsequent operations are performed similarly to that described previously.

As described above, in a continuous writing operation, the semiconductor memory device performs the precharge of the input and output line responsive to the column select line disable signal CSL Dis CLK subsequent to the first write command WR1. The device completes the precharge of the input and output line responsive to the column select line enable signal CSL En CLK subsequent to the second write command WR2. The device performs the write operation responsive to the second write command WR2.

Figure 3:
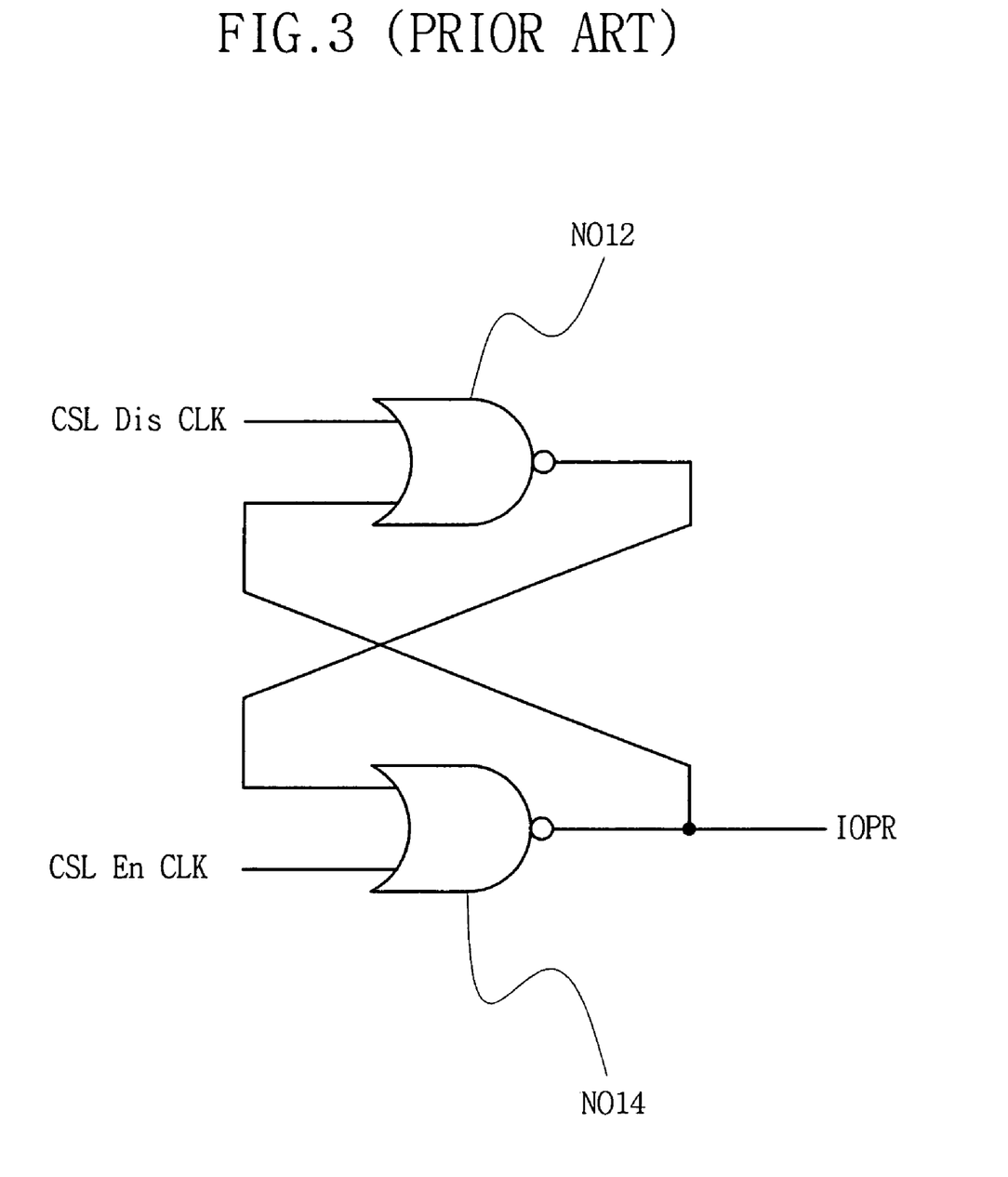
FIG. 3 is a schematic of a precharge control circuit.

FIG. 3 illustrates a precharge control circuit to generate a precharge control signal IOPR in semiconductor memory devices operating according to FIGS. 1 and 2.

As shown in FIG. 3, the precharge control circuit includes a latch made up of two NOR circuits NO12 and NO14. Each of the two NOR circuits NO12 and NO14 has two inputs and one output.

The first NOR circuit NO12 receives a column select line disable signal CSL D is CLK at one input. The second NOR circuit NO12 receives a column select line disable signal CSL Dis CLK at an output.

The second NOR circuit NO14 receives a column select line enable signal CSL En CLK at one input. The first NOR circuit NO12 receives a column select line enable signal CSL En CLK at an output. The output of the second NOR circuit NO14 is the precharge control signal IOPR.

In a semiconductor memory device as described above, the precharge of the input and output line is necessarily performed after read or write operations, unnecessarily increases current consumption. Accordingly, a need remains for an improved semiconductor memory device that reduces current consumption by adjusting the precharging of the input and output line. To reduce the current consumption, there exists a need for a semiconductor memory device capable of reducing current consumption by not performing the precharge of the input and output line in continuous writing operation.

SUMMARY OF THE INVENTION

An object of the present is to provide a semiconductor memory device and an associated method that address disadvantages associated with prior devices and methods.

Another object of the present is to provide a semiconductor memory device having a precharge control circuit and an associated precharging method capable of reducing current consumption.

We describe a semiconductor memory device, comprising an input and output line to transfer data to be written to a plurality of memory cells and a precharge control circuit to generate a precharge control signal, where the precharge control signal is adapted to disable the input and output line responsive to a continuous write operation.

The precharge control signal is adapted to disable the input and output line after a first write command and the precharge control signal is adapted to stay disabled after a second write command without other commands being applied after the first write command.

The device may comprise a plurality of memory banks each including a plurality of memory cells, where the continuous write operation occurs within a same memory bank.

The precharge control circuit includes a precharge blocking unit to generate a precharge blocking signal, the precharge blocking signal to maintain disabled the input and output line even after the second write command without other commands being applied after the first write command and a precharging unit to generate a precharge control signal, the precharge control signal to control precharging the input and output line responsive to the precharge blocking signal.

The precharging unit includes a logic circuit to logically manipulate an inverted version of the precharge blocking signal and a column select line disable signal and a latch circuit to generate the precharge control signal by latching an output of the logic circuit and a column select line enable signal.

The precharge blocking unit includes a first logic circuit to logically manipulate the first or second write command and a bank address signal. A second logic circuit synchronizes an output of the first logic circuit to an internal clock signal to output a first control signal. A delay circuit delays the first control signal by a predetermined time from the first write command to output a second control signal. A third logic circuit logically manipulates the first control signal and the second control signal to output a third control signal. And a pulse control unit generates the precharge blocking signal by converting the third control signal to a signal having a predetermined pulse width and a predetermined delay.

The precharge blocking signal has a pulse width as wide as a time from the first to the second write commands.

The first and third logic circuits are AND circuits.

The second logic circuit is a first flip flop and the delay circuit is at least one second flip flop.

The first and at least one second flip flop are D-flip flops.

The precharge blocking unit includes a first logic circuit to generate a first control signal by logically manipulating the first or second write command and a bank address signal and by logically manipulating a first output signal synchronous with an internal clock and a second output signal delayed from the first output signal by a predetermined delay only at a designated burst length. A delay circuit delays the first control signal by a delay time of the first logic circuit subtracted from a time length from the first to the second write command to output a second control signal. A second logic circuit logically manipulates the first and second control signals to output a third control signal. And a pulse control unit generates the precharge blocking signal by converting the third control signal to a signal having a predetermined pulse width and a predetermined delay.

The precharge blocking signal has a pulse width as wide as a time from the first to the second write commands.

The first logic circuit includes an AND circuit to logically manipulate the first or second write command and the bank address signal. A flip flop synchronizes the output of the AND circuit to the internal clock to output a first output signal. At least one flip flop delays the first output signal by a predetermined time only at a specific burst length to output a second output signal. And an OR circuit logically manipulates the second output signal and the first output signal to output the first control signal.

The second logic circuit is an AND circuit.

The delay circuit comprises at least one D flip flop.

We describe a method for precharging a semiconductor memory device, comprises applying a first write command to write data to a plurality of memory cells. The method comprises transferring data to an input and output line responsive to the first write command and disabling precharging of the input and output line. The method further includes writing data to the plurality of memory cells responsive to the first write command and applying a second write command without applying other intervening commands after the first write command and maintaining disabling precharging of the input and output line responsive to the second write command.

The method may be applied to a plurality of memory cells within a same memory bank.

We describe a method for precharging a semiconductor memory device, comprising disabling precharging an input and output line during a continuous write operation, continuously writing data into a plurality of memory cells, and repeating disabling precharging responsive to the continuously writing.

The method of claim 18 where the continuously writing includes continuously writing data to a plurality of memory cells within a same memory bank.

BRIEF DESCRIPTION OF THE DRAWINGS

We will describe embodiments of the device and method with reference to the following drawings.

DETAILED DESCRIPTION OF THE INVENTION

The accompanying drawings show embodiments of the device and method we describe in detail below. The invention should not be construed as limited to only the embodiments set forth. Rather, these embodiments are presented as teaching examples. Like numbers refer to like elements in the drawings.

An embodiment of the semiconductor memory device controls the precharge of an input and output line in a continuously performing write operation. An embodiment of the device comprises a series of circuits for writing data to memory cells.

The following description uses as an example a semiconductor memory device having a DDR function and a 4-bit prefetch structure including a plurality of memory banks each with a plurality of memory cells. It is assumed that the write operation is performed within the same memory bank.

Figure 4:
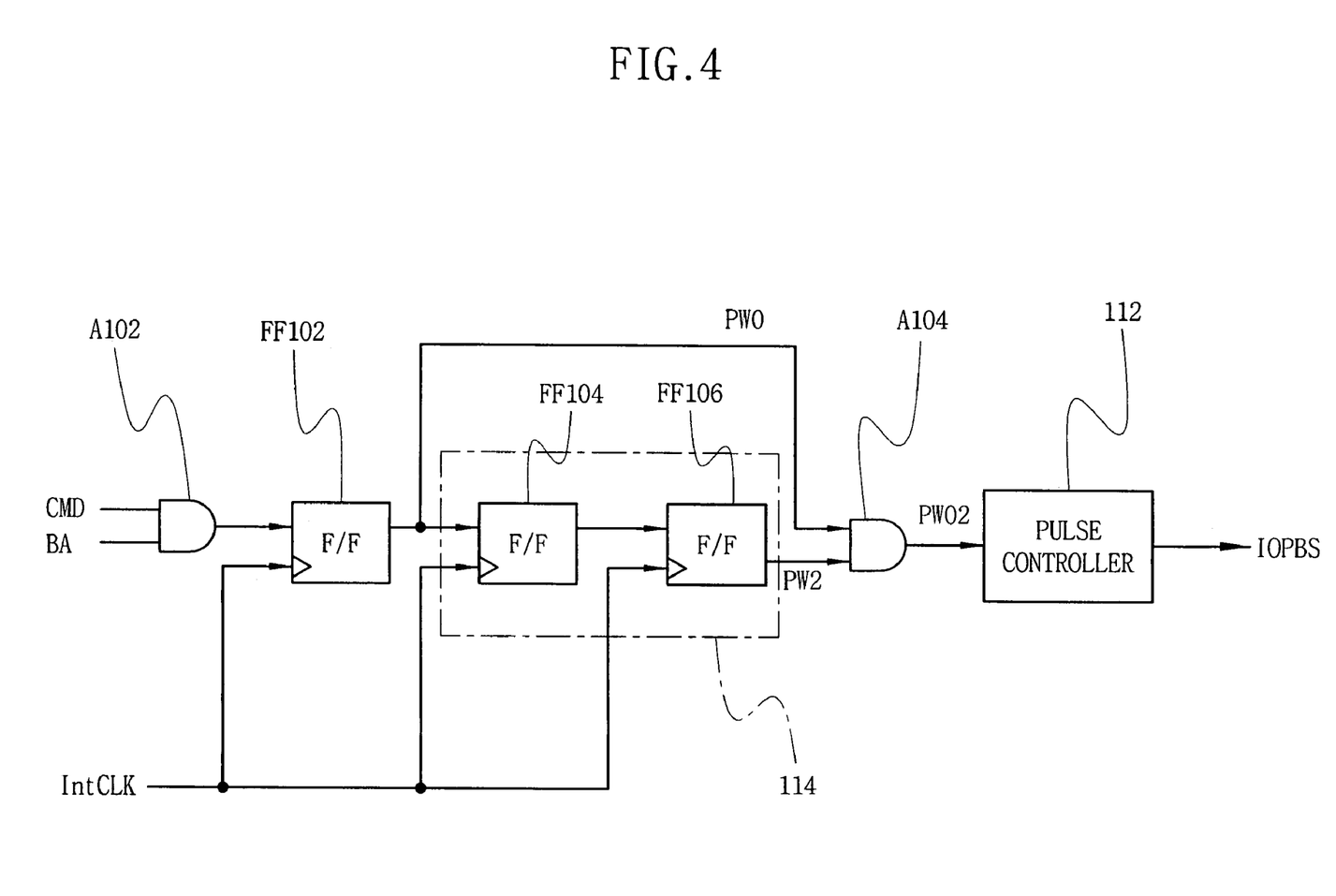
FIG. 4 is a block diagram of an embodiment of a precharge blocking unit.

FIG. 4 is a block diagram of an embodiment of a precharge blocking unit that forms a part of a precharge control circuit to precharge an input and output line in a semiconductor memory device. The device has a data burst length of 4.

The precharge control circuit includes a precharge blocking unit to generate a precharge blocking signal. The precharge blocking signal disables precharging the input and output line even after application of a second write command WR2. The precharge control circuit also includes precharging unit to generate a precharge control signal for controlling the precharge of the input and output line responsive to the precharge blocking signal.

As shown in FIG. 4, a precharge blocking unit comprises first, second and third logic circuits A102, FF102, and A104, a delay circuit 114, and a pulse control unit 112.

The first logic circuit A102 logically manipulates a first write command CMD or a second write command CMD and a bank address signal BA. The first logic circuit A102 may comprise an AND circuit.

The second logic circuit FF102 synchronizes an output signal of the first logic circuit A102 with an internal clock signal Int CLK. The second logic circuit FF102 generates a first control signal PW0. The second logic circuit FF102 may comprise a flip flop, e.g., a D flip flop.

The delay circuit 114 delays the first control signal PW0 by a length of time from the first write command application CMD to the second write command application CMD to output a second control signal PW2. Since the burst length is 4, the second control signal PW2 is delayed from the first control signal PW0 by two cycles of the external clock signal Ext CLK.

The delay circuit 114 may comprise two flip flops FF104 and FF106 operating synchronous to the internal clock signal Int CLK. Each of the flip flops FF104 and FF106 may be a D flip flop.

The third logic circuit A104 logically manipulates the first control signal PW0 and the second control signal PW2 to output a third control signal PW02. The third logic circuit A104 may comprise a logical AND circuit.

The pulse control unit 112 generates the precharge blocking signal IOPBS by converting the third control signal PW02 to a signal having a predetermined pulse width and a predetermined delay. The pulse control unit 112 may be implemented by any of various well known ways to perform such a function.

Figure 5:
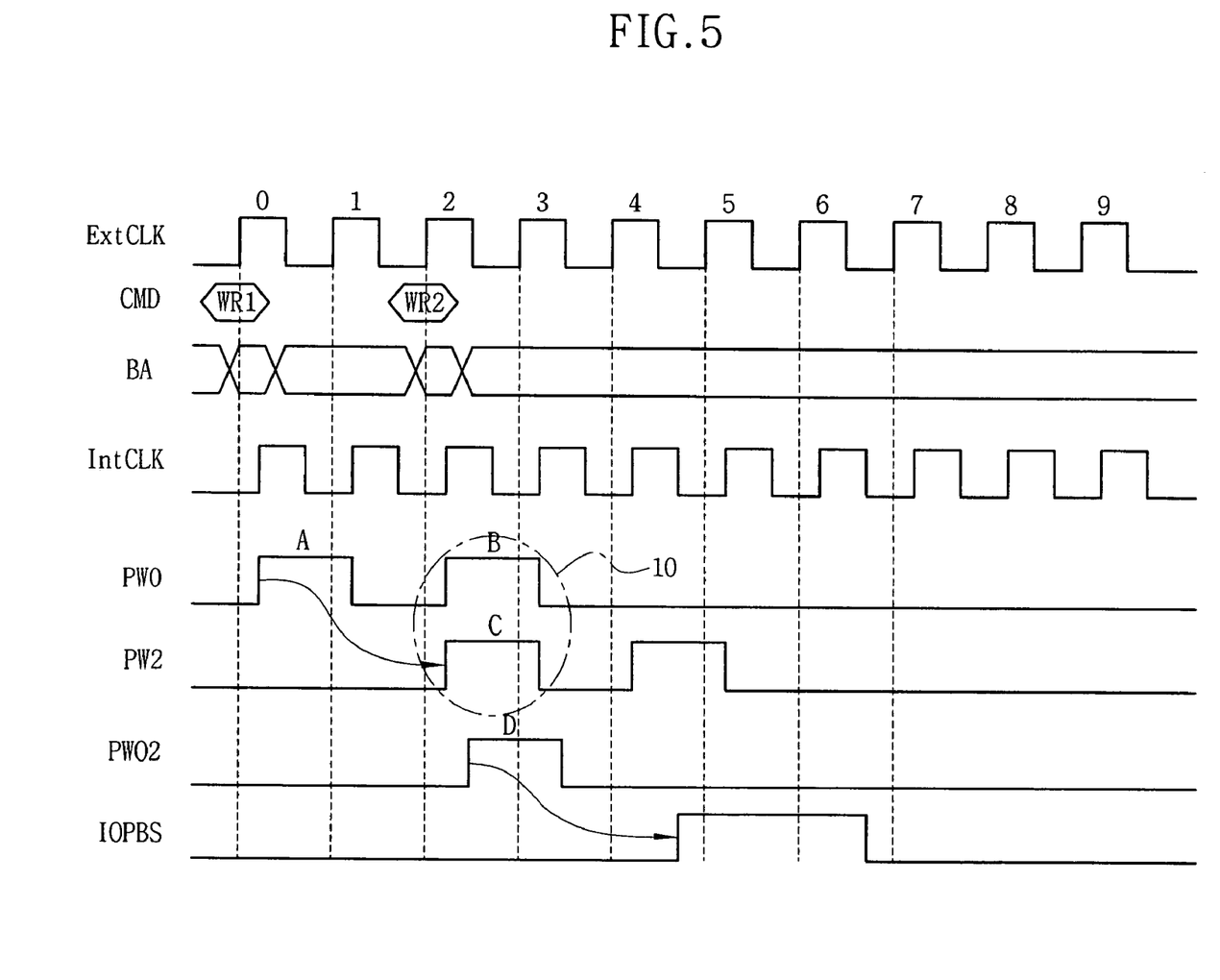
FIG. 5 is a timing diagram associated with the precharge blocking unit of FIG. 4.

FIG. 5 is a timing diagram associated with the precharge blocking unit. As shown in FIG. 5, the first write command WR1 is applied synchronous with the external clock signal Ext CLK, pulse 0, and the bank address signal BA for selecting any one of the plurality of memory banks is applied. The first logic circuit A102 logically ANDs the first write command WR1 and the bank address signal BA. The second logic circuit FF102 outputs the first control signal PW0, pulse A. Responsive to the first control signal PW0, the delay circuit 114 outputs the second control signal PW2, pulse C, which is delayed by two cycles from the external clock signal Ext CLK synchronized to the internal clock Int CLK. If the second write command WR2 is applied synchronous with the external clock signal Ext CLK, pulse 2, the first logic circuit A102 logically ANDs the second write command WR2 and the bank address signal BA. And the second logic circuit FF102 outputs the first control signal PW0, pulse B. Accordingly, a time 10 exists in which the pulse B and the pulse C overlap each other. The third logic circuit A104 logically manipulates the pulse B and the pulse C to generate the third control signal PW02, pulse D. The pulse control unit 112 delays the third control signal PW02 by a certain period of time and outputs a precharge blocking signal IOPBS having a suitable pulse width. In an embodiment, the precharge blocking signal IOPBS may be delayed by clock latency from the third control signal PW02 and have a pulse width as wide as a time from the first write command WR1 to the second write command WR2.

Figure 6:
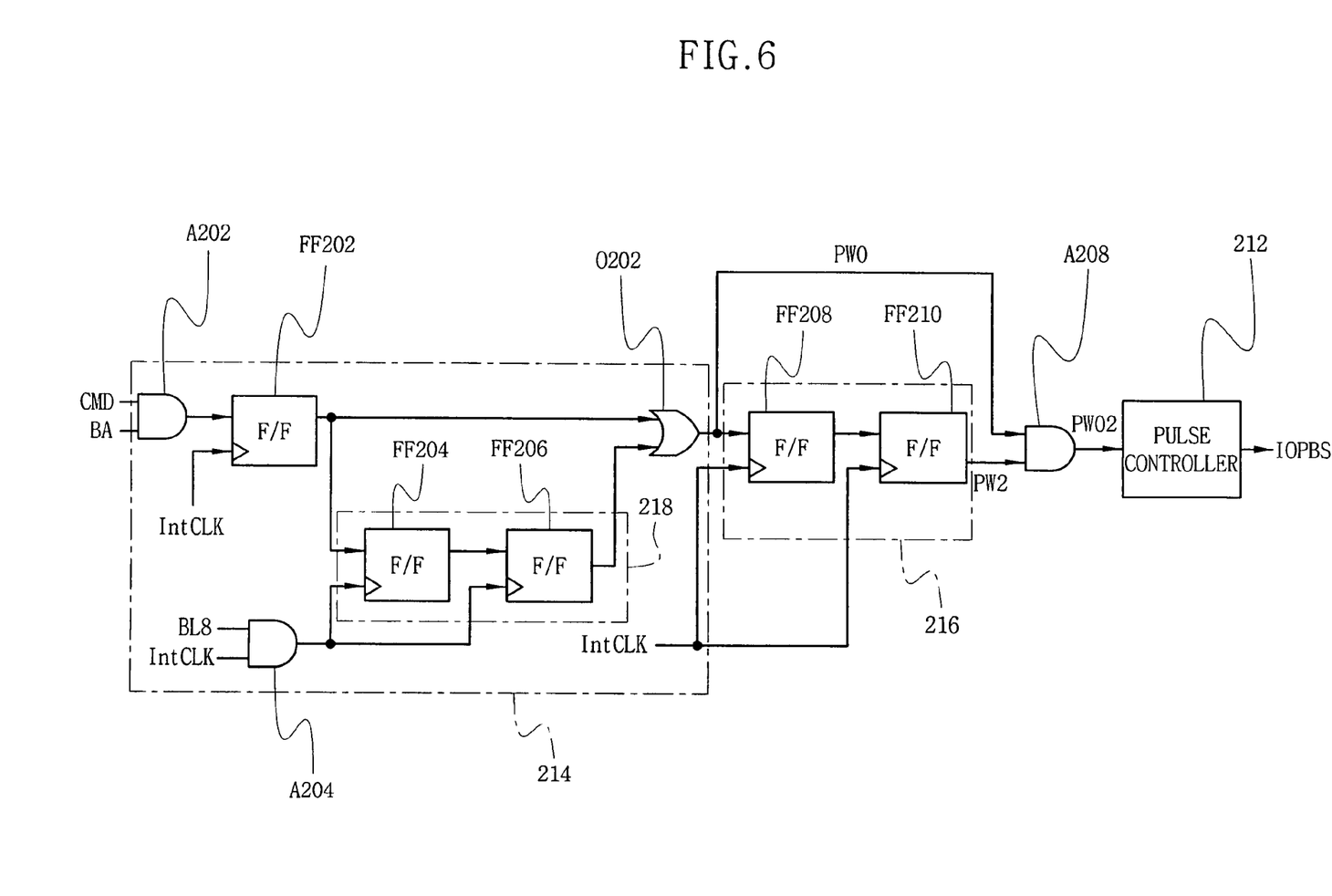
FIG. 6 is a block diagram of an embodiment of a precharge blocking unit.

FIG. 6 is a block diagram of an embodiment that forms a precharge blocking unit that is a part of a precharge control circuit to precharge an input and output line in a semiconductor memory device. The device has a data burst length of 4 and 8.

As shown in FIG. 6, a precharge blocking unit comprises a first logic circuit 214, a delay circuit 216, a second logic circuit A208, and a pulse control unit 212.

The precharge blocking unit is implemented as a structure to perform the operation two times with the burst length being 4 as shown in FIG. 4.

The first logic circuit 214 logically manipulates a first write command CMD or a second write command CMD and a bank address signal BA to output a first output signal synchronous with an internal clock signal INT CLK. And the first logic circuit 214 delays the first output signal by a predetermined delay at a specific burst length (e.g., 8) to output a second output signal. The first logic circuit 214 then logically manipulates the first output signal and the second output signal to output a first control signal PW0.

The first logic circuit 214 may comprise an AND circuit A202 for logically ANDing the first write command CMD or the second write command CMD and the bank address signal BA. A flip flop FF202 synchronizes an output of the first AND circuit A202 to the internal clock Int CLK to output the first output signal. A delay unit 218 comprises at least one flip flop to delay the first output signal by a predetermined period of time only at a specific burst length to output the second output signal. A OR circuit O202 logically ORs the second output signal and the first output signal to output the first control signal PW0.

The delay unit 218 operates only when a specific burst length recognition signal BL8 and the internal clock signal Int CLK are input and does not operate when the burst length is otherwise, e.g., a burst length of 4.

The delay circuit 216 delays the first control signal PW0 by a predetermined delay time (e.g., two cycles from the external clock signal Ext CLK) in the delay unit 218 subtracted from the time length (e.g., four cycles from the external clock signal Ext CLK) after the first write command CMD to the second write command CMD and outputs the second control signal PW2.

The delay circuit 216 may comprise at least one flip flop that operates synchronously with the internal clock signal Int CLK. The flip flop may be a D flip flop.

The second logic circuit A208 logically manipulates the first control signal PW0 and the second control signal PW2 to output the third control signal PW02. The second logic circuit A208 may comprise an AND circuit.

The pulse control unit 212 generates the precharge blocking signal IOPBS by converting the third control signal PW02 to a signal having a predetermined pulse width and a predetermined delay. The pulse control unit 212 may be implemented by any of various well known ways to perform such a function. The precharge blocking signal IOPBS may be delayed by clock latency from the third control signal PW02 and have a pulse width of a length from the first write command WR1 to the second write command WR2. For example, when the burst length is 4, the precharge blocking signal IOPBS may have a pulse width as wide as two cycles from the external clock signal Ext CLK. When the burst length is 8, it may have a pulse width as wide as four cycles.

Figure 7:
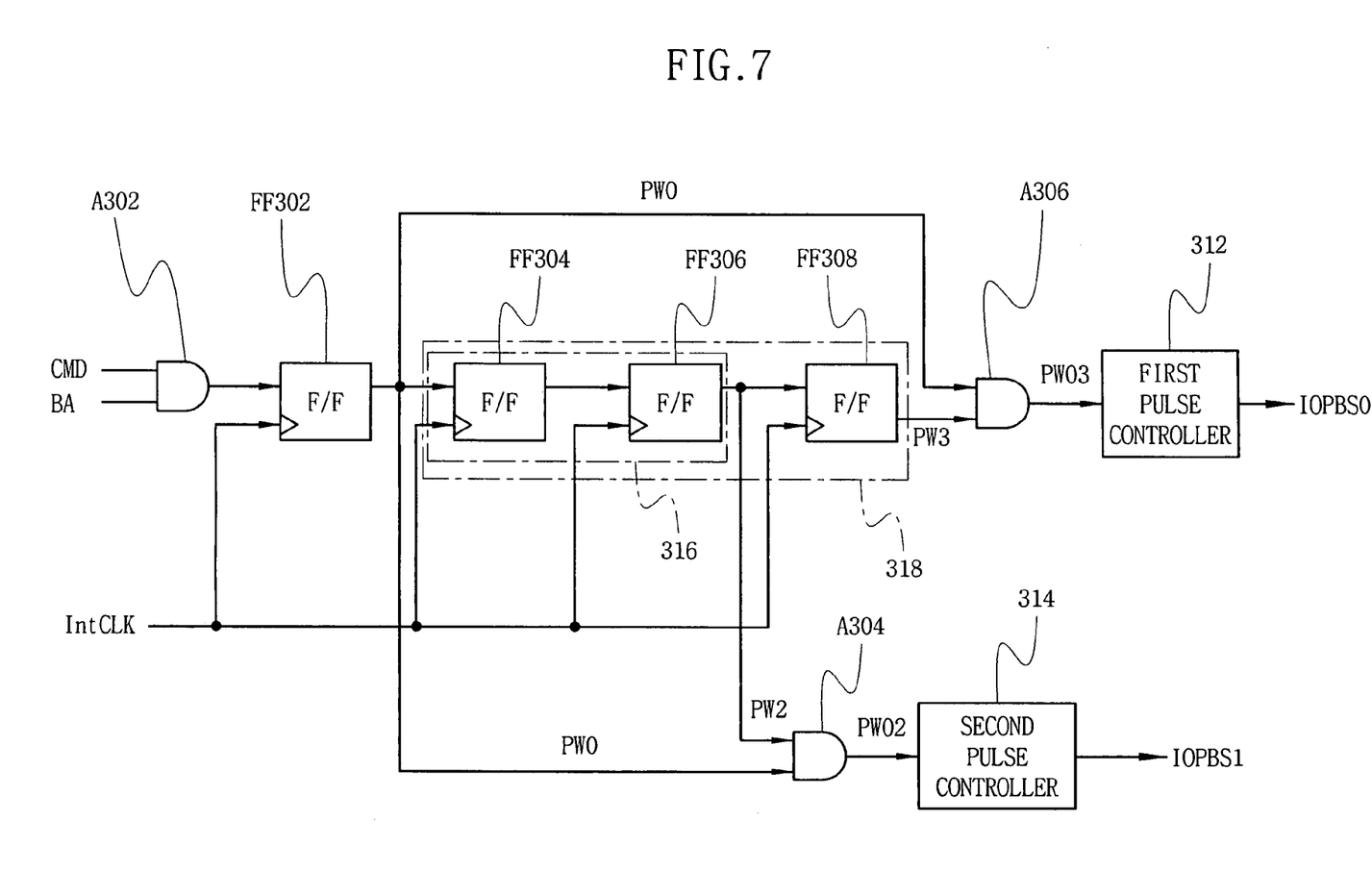
FIG. 7 is a block diagram of an embodiment of a precharge blocking unit.

FIG. 7 is a block diagram of an embodiment of a precharge blocking unit that forms a part of a precharge control circuit in a semiconductor memory device. In FIG. 7, a write command continuously writes data of a burst length corresponding to 4 applied at two-cycle intervals from an external clock signal Ext CLK. There is a gap of one cycle from the external clock signal Ext CLK.

As shown in FIG. 7, a precharge blocking unit comprises first, second, and third logic circuits A302, FF302, and A306, a delay circuit 318, and first and second pulse control units 312 and 314.

The first logic circuit A302 logically manipulates a first write command CMD or a second write command CMD and a bank address signal BA. The first logic circuit A302 may comprise an AND circuit.

The second logic circuit FF302 synchronizes an output signal of the first logic circuit A302 to the internal clock signal Int CLK to output the first control signal PW0. The second logic circuit FF302 may comprise a flip flop, e.g., a D flip flop.

The delay circuit 318 delays the first control signal PW0 by a time length from the first write command CMD to the second write command CMD. The delay circuit 318 outputs the second control signal PW2 and the second signal PW3.

The second control signal PW2 is output with a delay by two cycles from the external clock signal Ext CLK relative to the first control signal PW0 when the first write command and the second write command are applied at two-cycle intervals from the external clock signal Ext CLK without a gap therebetween. The second control signal PW3 is output with a delay of three cycles from the external clock signal Ext CLK relative to the first control signal PW0 when the second command subsequent to the first write command is applied after three cycles of the external clock signal Ext CLK, e.g., there is a gap of one cycle between the commands.

The delay circuit 318 may comprise three flip flop FF304, FF306 and FF308 circuits synchronized to the internal clock signal Int CLK. The flip flop FF304, FF306 and FF308 circuits may comprise D flip flops.

The third logic circuit comprises two AND circuits A304 and A306. The first AND circuit A304 operates when there is no gap between continuous write commands and logically manipulates the first control signal PW0 and the second control signal PW2 to output a third control signal PW02. The second AND circuit A306 of the two AND circuits A304 and A306 operates when there is a gap between continuous write commands and performs logical combination on the first control signal PW0 and the second control signal PW3 to output a third control signal PW03.

The second pulse control unit 314 converts the third control signal PW02 to a signal having a predetermined pulse width and a predetermined delay to generate the precharge blocking signal IOPBS1. The pulse control unit 314 may be implemented by any of various well known ways to perform such a function. The precharge blocking signal IOPBS1 may have a pulse width as wide as the time from the first write command to the second write command.

The first pulse control unit 312 converts the third control signal PW03 to a signal having a predetermined pulse width and a predetermined delay to generate the precharge blocking signal IOPBS0. The second pulse control unit 312 may be implemented by any of various well known ways to perform such a function. The precharge blocking signal IOPBS0 may have a pulse width as wide as the time from the first write command to the second write command.

While FIG. 7 describes the case where there is no gap between the continuous write commands and the case where there is one cycle, it will be apparent to those skilled in the art that the precharge blocking unit may be easily implemented through the application of FIG. 7 when there is a gap.

Figure 8:
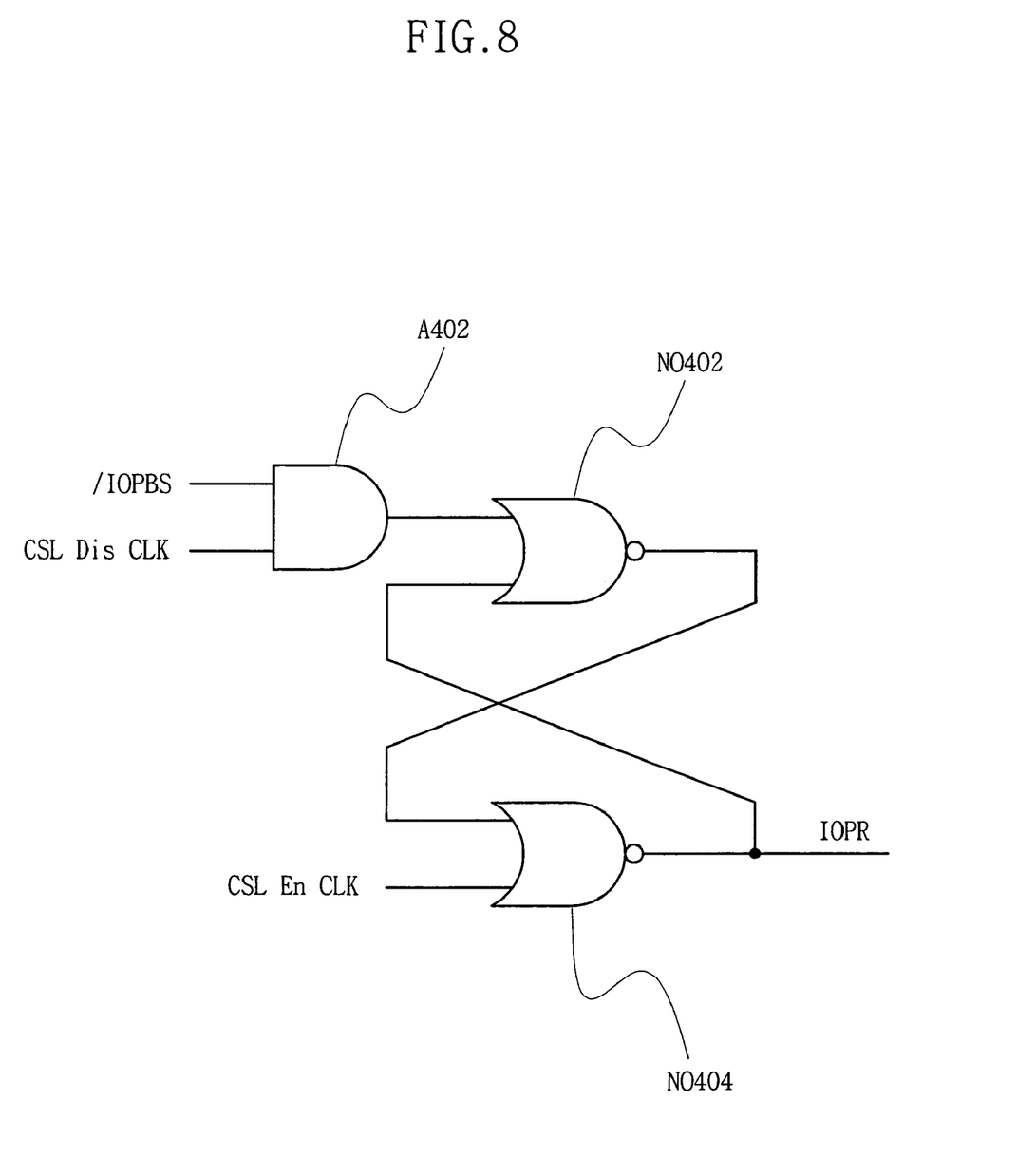
FIG. 8 is an embodiment of a precharging unit.

FIG. 8 is a block diagram of an embodiment of a precharging unit that forms a part of a precharge control circuit in a semiconductor memory device. As shown in FIG. 8, the precharging unit comprises a logic circuit A402 to logically manipulate an inverted version of a precharge blocking signal/IOPBS and a column select line disable signal CSL Dis CLK. A latch circuit receives an output of the logic circuit A402 and a column select line enable signal CSL En CLK to generate a precharge control signal IOPR.

The logic circuit A402 may comprise an AND circuit. The latch circuit may comprise two NOR circuits NO402 and NO404. Each of the two NOR circuits NO402 and NO404 has two inputs and one output.

The first NOR circuit NO402 receives an output signal of the logic circuit A402 at one input. The first NOR circuit NO402 receives an output signal of the second NOR circuit NO404 at another input.

The second NOR circuit N404 receives the column select line enable signal CSL En CLK at one input and an output signal of the first NOR circuit NO402 at another input. The output signal of the second NOR circuit NO404 functions as the precharge control signal IOPR.

Figure 9:
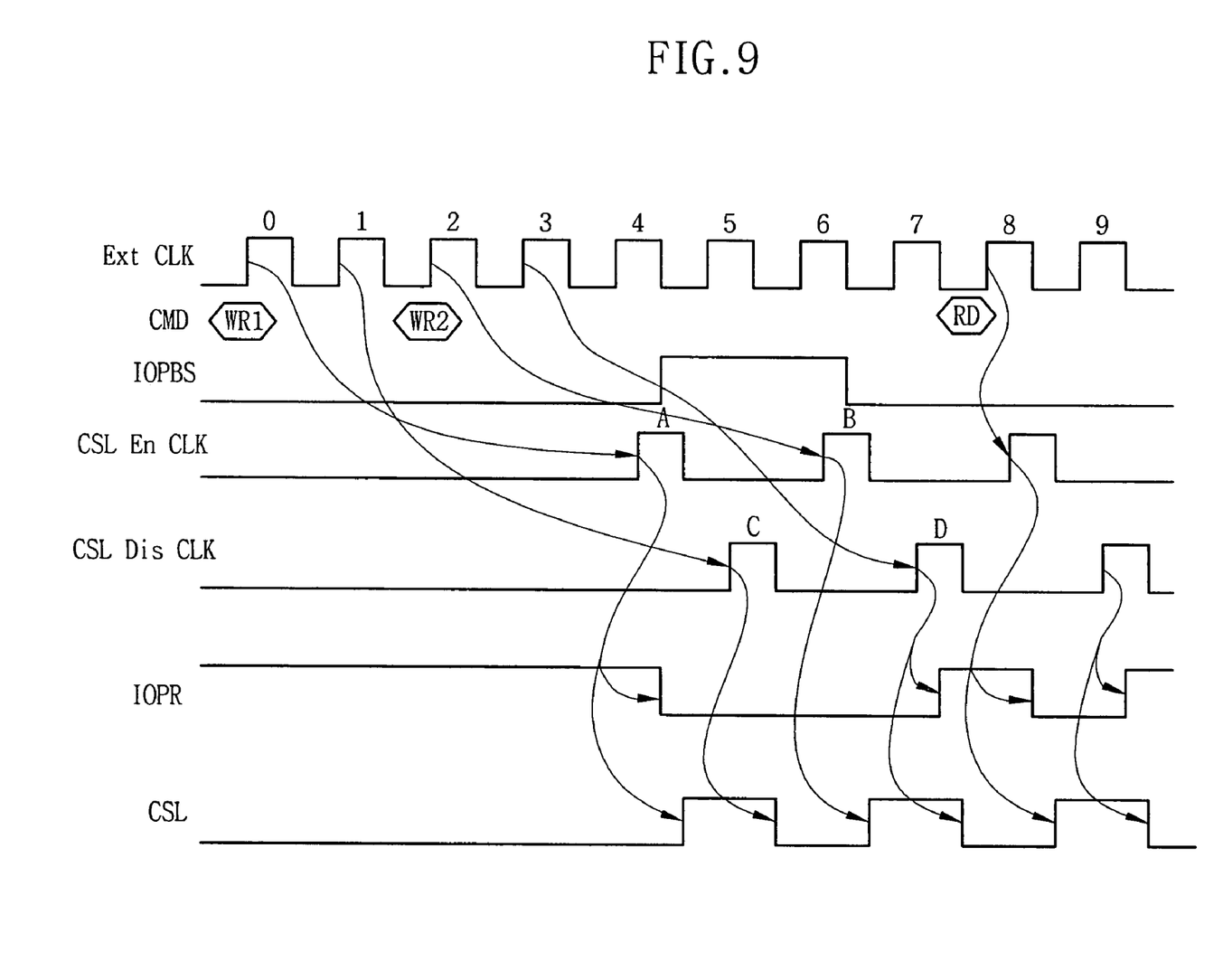
FIG. 9 is a timing diagram of a precharge control signal and a column select line signal when data of a burst length corresponding to 4 is continuously written in an embodiment of a semiconductor memory device.
Figure 10:
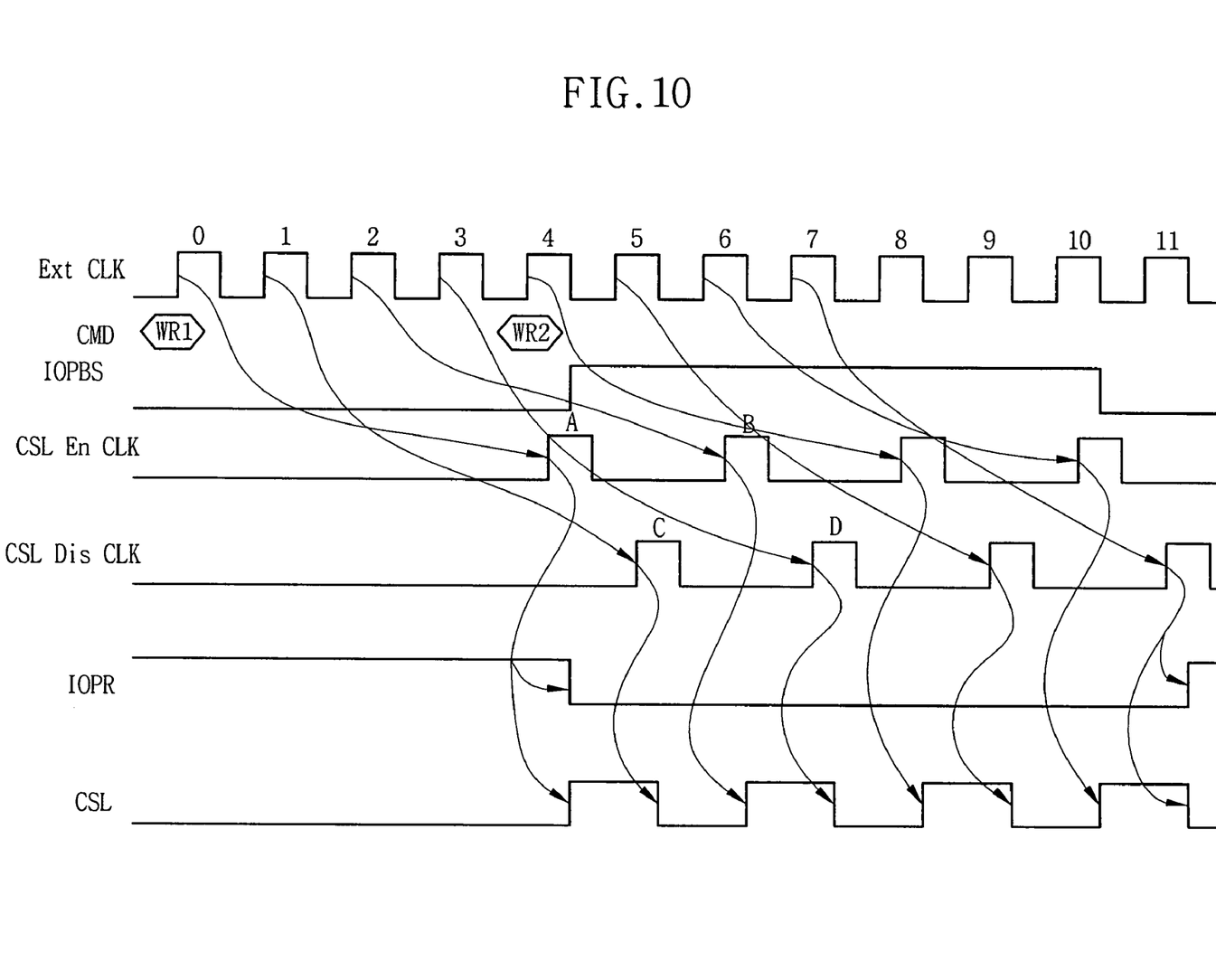
FIG. 10 is a timing diagram of a precharge control signal and a column select line signal when data of a burst length corresponding to 8 is continuously written in an embodiment of a semiconductor memory device.

FIGS. 9 and 10 are timing diagrams of a precharge control signal and a column select line signal of an input and output line for a continuous write operation when used in the precharge control circuit of FIG. 8. In FIG. 9, the burst length is 4. FIG. 10 is a timing diagram for writing data corresponding to a burst length of 8.

As shown in FIG. 9, an external clock signal Ext CLK and a first write command WR1 are applied. After two cycles from the external clock signal Ext CLK, a second write command WR2 is applied. The first write command WR1 and the second write command WR2 enable the semiconductor memory device to perform a write operation and are applied synchronous with the external clock signal Ext CLK.

When the first write command WR1 is applied synchronous with pulse 0, a column select line enable signal CSL En CLK, pulse A, is enabled responsive to a rising edge of the pulse 0 with a predetermined delay. The delay of the column select line enable signal CSL En CLK depends on write latency.

Responsive to a rising edge of the pulse A, a precharge control signal IOPR is disabled and the column select line CSL is enabled.

As a result, data is then transferred via the input and output line and the write operation responsive to the first write command WR1 is performed. A column select line disable signal CSL Dis CLK, pulse C, is then enabled responsive to a rising edge of pulse 1 that is a next cycle of the pulse 0. The column select line CSL is disabled responsive to a rising edge of the pulse C.

While the prior art allows the precharge control signal IOPR to be enabled to perform the precharge of the input and output line responsive to the rising edge of the pulse C, the present allows the precharge control signal to be blocked from being enabled by the pulse C responsive to the precharge blocking signal IOPBS. Accordingly, the input and output line remains in the precharge disable state.

After two cycles from the external clock signal Ext CLK without other commands after the first write command WR1, the second write command WR2 is applied synchronous with pulse 2. If the second write command WR2 is applied, the column select line enable signal CSL En CLK, pulse B, is enabled in response to a rising edge of the pulse 2 with a predetermined delay. The delay of the column select line enable signal CSL En CLK depends on write latency.

The column select line CSL is enabled responsive to a rising edge of the pulse B. Here, the input and output line remains in the precharge disable state.

Data is then transferred via the input and output line and the write operation responsive to the second write command WR2 is performed. The column select line disable signal CSL Dis CLK, pulse D, is then enabled responsive to a rising edge of pulse 3 that follows the pulse 2 that is the external clock signal Ext CLK. Responsive to a rising edge of the pulse D, the column select line CSL is disabled and the precharge control signal IOPR is enabled so that the precharge of the input and output line is performed.

As described above, for a continuous write operation, the semiconductor memory device is capable of reducing current consumption due to the precharge by not performing the precharge operation of the input and output line when it is not necessary.

If a read command RD is applied, the operation as in the prior art is performed. However, if the third write command is applied subsequent to the second write command WR2, the precharge control signal IOPR of the input and output line maintains its disable state until a write operation responsive to the third write command ends.

As shown in FIG. 10, when the first write command WR1 is applied synchronous with the pulse 0 of the external clock signal Ext CLK, a column select line enable signal CSL En CLK, pulse A, is enabled responsive to a rising edge of the pulse 0 with a predetermined delay. The delay of the column select line enable signal CSL En CLK depends on write latency.

Responsive to a rising edge of the pulse A, a precharge control signal IOPR is disabled so that the precharge of the input and output line stops and the column select line CSL is enabled.

Data is then transferred via the input and output line and the write operation responsive to the first write command WR1 is partially performed. A column select line disable signal CSL Dis CLK, pulse C, is enabled responsive to a rising edge of pulse 1 that follows pulse 0. The column select line CSL is disabled responsive to a rising edge of the pulse C.

While the prior art allows the precharge control signal IOPR to be enabled to perform the precharge of the input and output line responsive to the rising edge of the pulse C, the present allows the precharge control signal IOPR to be maintained in the disable state responsive to the precharge blocking signal IOPBS when the write commands WR1 and WR2 are continuously applied.

The column select line enable signal CSL En CLK, pulse B, is enabled responsive to a rising edge of the pulse 2, which is the external clock signal Ext CLK with a predetermined delay. The delay of the column select line enable signal CSL En CLK depends on write latency.

The column select line CSL is again enabled responsive to a rising edge of the pulse B. Accordingly, data is transferred via the input and output line and the remaining writing operation responsive to the first write command WR1 is performed.

The column select line disable signal CSL Dis CLK, pulse D is then enabled responsive to a rising edge of pulse 3 that follows the pulse 2. Responsive to a rising edge of the pulse D, the column select line CSL is disabled. Here, the precharge control signal IOPR is not enabled but remains in the disable state, unlike the conventional case.

The second write command WR2 is applied synchronous with pulse 4 after four cycles from the external clock signal Ext CLK without other commands after the first write command WR1 application. If the second write command WR2 is applied, subsequent operation is performed similarly to the case where the first write command WR1 is applied. If the third write command is not applied, a column select line disable signal CSL Dis CLK is then enabled responsive to a rising edge of pulse 7 to disable the column select line CSL. In addition, responsive to the rising edge of the pulse 7, the precharge control signal IOPR is enabled so that the precharge of the input and output line is performed.

As described above, when the write command is continuously applied and other commands are not applied, a disable state of the precharge control signal IOPR, is maintained until the write operation is performed responsive to a last write command. Accordingly, it is possible to reduce current consumption by not performing the precharge of the input and output line when it is not necessary.

The present has been described using preferred exemplary embodiments. However, it is to be understood that the scope is not limited to the disclosed embodiments. On the contrary, the scope is intended to include various modifications and alternative arrangements within the capabilities of persons skilled in the art using presently known or future technologies and equivalents. The scope of the claims, therefore, should be accorded the broadest interpretation so as to encompass all such modifications and similar arrangements.

As described above, when a continuous write operation is performed, the disable state of the precharge control signal is maintained until the write operation is performed responsive to a last write command. The precharge control signal becomes disabled responsive to an initial write command. Accordingly, it is possible not to perform the precharge of the input and output line during a continuous write operation, thereby reducing current consumption.

I claim:

1. A semiconductor memory device, comprising:
   an input and output line to transfer data to be written to a plurality of memory cells;
   a precharge control circuit to generate a precharge control signal, the precharge control circuit including:
      a precharge blocking unit to generate a precharge blocking signal, the precharge blocking signal to maintain disabled the input and output line precharge even after the second write command when other commands are not being applied after the first write command; and
      a precharging unit to generate a precharge control signal, the precharge control signal to control precharging the input and output line responsive to the precharge blocking signal, where the precharge control signal is adapted to disable the input and output line precharge responsive to a continuous write operation within a same memory bank, the precharging unit including:
         a logic circuit to logically manipulate an inverted version of the precharge blocking signal and a column select line disable signal; and
         a latch circuit to generate the precharge control signal by latching an output of the logic circuit and a column select line enable signal; and
   a plurality of memory banks each including a plurality of memory cells, where the continuous write operation occurs within the same memory bank according to a same memory bank address.

2. The semiconductor memory device of claim 1
   where the precharge control signal is adapted to disable the input and output line precharge after a first write command; and
   where the precharge control signal is adapted to stay disabled after a second write command when other commands are not being applied after the first write command.

3. The semiconductor memory device of claim 1 where the precharge blocking unit includes:
   a first logic circuit to logically manipulate the first or second write command and a bank address signal;
   a second logic circuit to synchronize an output of the first logic circuit to an internal clock signal to output a first control signal;
   a delay circuit to delay the first control signal by a predetermined time from the first write command to output a second control signal;
   a third logic circuit to logically manipulate the first control signal and the second control signal to output a third control signal; and
   a pulse control unit to generate the precharge blocking signal by converting the third control signal to a signal having a predetermined pulse width and a predetermined delay.

4. The semiconductor memory device of claim 1 where the precharge blocking signal has a pulse width as wide as a time from the first to the second write commands.

5. The semiconductor memory device of claim 3 where the first and third logic circuits are AND circuits.

6. The semiconductor memory device of claim 5
   where the second logic circuit is a first flip flop; and
   where the delay circuit is at least one second flip flop.

7. The semiconductor memory device of claim 6 where the first and at least one second flip flop are D-flip flops.

8. The semiconductor memory device of claim 1 where the precharge blocking unit includes:
   a first logic circuit to generate a first control signal by logically manipulating the first or second write command and a bank address signal and by logically manipulating a first output signal synchronous with an internal clock and a second output signal delayed from the first output signal by a predetermined delay only at a designated burst length;
   a delay circuit to delay the first control signal by a delay time of the first logic circuit subtracted from a time length from the first to the second write command to output a second control signal;
   a second logic circuit to logically manipulate the first and second control signals to output a third control signal; and
   a pulse control unit to generate the precharge blocking signal by converting the third control signal to a signal having a predetermined pulse width and a predetermined delay.

9. The semiconductor memory device 8 where the precharge blocking signal has a pulse width as wide as a time from the first to the second write commands.

10. The semiconductor memory device of claim 9 where the first logic circuit includes:
    an AND circuit to logically manipulate the first or second write command and the bank address signal;
    a flip flop to synchronize the output of the AND circuit to the internal clock to output a first output signal;
    at least one flip flop to delay the first output signal by a predetermined time only at a specific burst length to output a second output signal; and an OR circuit to logically manipulate the second output signal and the first output signal to output the first control signal.

11. The semiconductor memory device of claim 9 where the second logic circuit is an AND circuit.

12. The semiconductor memory device of claim 10 where the delay circuit comprises at least one D flip flop.

13. A method, comprising:
applying a first write command to write data to a plurality of memory cells;
transferring data to an input and output line responsive to the first write command;
generating a precharge control signal responsive to a precharge blocking signal;
disabling precharging of the input and output line responsive to the precharge control signal;
writing data to the plurality of memory cells responsive to the first write command;
applying a second write command without applying other intervening commands after the first write command;
maintaining disabling precharging of the input and output line responsive to the second write command;
using a logic circuit to logically manipulate an inverted version of the precharge blocking signal and a column select line disable signal; and
generating the precharge control signal by latching an output of the logic circuit and a column select line enable signal.

14. The method of claim 13 where the method is applied to a plurality of memory cells within a same memory bank.

15. A semiconductor memory device, comprising:
an input and output line to transfer data to be written to a plurality of memory cells;
a precharge control circuit to generate a precharge control signal, where the precharge control signal is adapted to disable the input and output line responsive to a continuous write operation, and where the precharge control circuit includes:
a precharge blocking unit to generate a precharge blocking signal, the precharge blocking signal to maintain disabled the input and output line even after the second write command when other commands are not being applied after the first write command; and
a precharging unit to generate a precharge control signal, the precharge control signal to control precharging the input and output line responsive to the precharge blocking signal, where the precharging unit includes:
a logic circuit to logically manipulate an inverted version of the precharge blocking signal and a column select line disable signal; and
a latch circuit to generate the precharge control signal by latching an output of the logic circuit and a column select line enable signal; and
a plurality of memory banks each including a plurality of memory cells, where the continuous write operation occurs within a same memory bank.

16. The semiconductor memory device of claim 15 where the precharge blocking unit includes:
a first logic circuit to logically manipulate the first or second write command and a bank address signal;
a second logic circuit to synchronize an output of the first logic circuit to an internal clock signal to output a first control signal;
a delay circuit to delay the first control signal by a predetermined time from the first write command to output a second control signal;
a third logic circuit to logically manipulate the first control signal and the second control signal to output a third control signal; and
a pulse control unit to generate the precharge blocking signal by converting the third control signal to a signal having a predetermined pulse width and a predetermined delay.

17. The semiconductor memory device of claim 15 where the precharge blocking signal has a pulse width as wide as a time from the first to the second write commands.

18. The semiconductor memory device of claim 16 where the first and third logic circuits are AND circuits.

19. The semiconductor memory device of claim 18
where the second logic circuit is a first flip flop; and
where the delay circuit is at least one second flip flop.

20. The semiconductor memory device of claim 19 where the first and at least one second flip flop are D-flip flops.

21. The semiconductor memory device of claim 15 where the precharge blocking unit includes:
a first logic circuit to generate a first control signal by logically manipulating the first or second write command and a bank address signal and by logically manipulating a first output signal synchronous with an internal clock and a second output signal delayed from the first output signal by a predetermined delay only at a designated burst length;
a delay circuit to delay the first control signal by a delay time of the first logic circuit subtracted from a time length from the first to the second write command to output a second control signal;
a second logic circuit to logically manipulate the first and second control signals to output a third control signal; and
a pulse control unit to generate the precharge blocking signal by converting the third control signal to a signal having a predetermined pulse width and a predetermined delay.

22. The semiconductor memory device 21 where the precharge blocking signal has a pulse width as wide as a time from the first to the second write commands.

23. The semiconductor memory device of claim 22 where the first logic circuit includes:
an AND circuit to logically manipulate the first or second write command and the bank address signal;
a flip flop to synchronize the output of the AND circuit to the internal clock to output a first output signal;
at least one flip flop to delay the first output signal by a predetermined time only at a specific burst length to output a second output signal; and
an OR circuit to logically manipulate the second output signal and the first output signal to output the first control signal.

24. The semiconductor memory device of claim 22 where the second logic circuit is an AND circuit.

25. The semiconductor memory device of claim 23 where the delay circuit comprises at least one D flip flop.

* * * * *